United States Patent
Lechthaler

(12) 
(10) Patent No.: US 8,491,989 B2
(45) Date of Patent: Jul. 23, 2013

(54) COATING SYSTEM, COATED WORKPIECE AND METHOD FOR MANUFACTURING THE SAME

(75) Inventor: Markus Lechthaler, Feldkirch (AT)

(73) Assignee: Oberlikon Trading AG, Truebbach, Truebbach (CH)

( * ) Notice: Subject to any disclaimer, the term of this patent is extended or adjusted under 35 U.S.C. 154(b) by 194 days.

(21) Appl. No.: 13/002,687

(22) PCT Filed: Jul. 3, 2009

(86) PCT No.: PCT/EP2009/058423
§ 371 (c)(1),
(2), (4) Date: Jan. 5, 2011

(87) PCT Pub. No.: WO2010/003902
PCT Pub. Date: Jan. 14, 2010

(65) Prior Publication Data
US 2011/0111193 A1    May 12, 2011

Related U.S. Application Data

(60) Provisional application No. 61/079,230, filed on Jul. 9, 2008.

(51) Int. Cl.
*B32B 9/00* (2006.01)

(52) U.S. Cl.
USPC ............ 428/216; 51/307; 51/309; 204/192.1; 204/192.15; 204/192.16; 428/336; 428/469; 428/472; 428/697; 428/698; 428/699

(58) Field of Classification Search
USPC ................... 51/307, 309; 428/216, 336, 469, 428/472, 697, 698, 699; 204/192.1, 192.15, 204/192.16
See application file for complete search history.

(56) References Cited

U.S. PATENT DOCUMENTS 6,824,601 B2 * 11/2004 Yamamoto et al. ........... 428/698
7,348,074 B2    3/2008 Derflinger
(Continued)

FOREIGN PATENT DOCUMENTS

JP    06-322517    * 11/1994
JP    2002-160129    * 6/2002
(Continued)

OTHER PUBLICATIONS

Vetter et al "(Cr:Al)N coatings deposited by cathodic vacuum arc evaporation" Surface & Coatings Techn. 98 (1998) p. 1233-1239.*

(Continued)

*Primary Examiner* — Archene Turner
(74) *Attorney, Agent, or Firm* — Pearne & Gordon LLP

(57) ABSTRACT

The coating system comprises: at least one layer of type A, a layer of type A substantially consisting of $(Al_yCr_{1-y})X$, wherein X depicts one of the group consisting of N, CN, BN, NO, CNO, CBN, BNO and CNBO, y describing the stoichiometric composition of the metallic phase fraction; and at least one layer of type B, a layer of type B substantially consisting of $(Al_uCr_{1-u-v-w}Si_vMe_w)X$, wherein X depicts one of the group consisting of N, CN, BN, NO, CNO, CBN, BNO or CNBO, and wherein Me depicts one of the group consisting of W, Nb, Mo and Ta or a mixture of two or more of the constituents of that group, u, v and w describing the stoichiometric composition of the metallic phase fraction. A thickness ratio of said layer of type A to said layer of type B is higher than 1. The workpiece comprises such a coating system. Through this, an excellent wear-protection is provided, and the coating system and workpieces can be used for a broad range of different applications. The coating system can be deposited very efficiently in a PVD process using two types of targets, wherein targets of one type are active during depositing a layer of type A and during depositing a layer of type B.

35 Claims, 4 Drawing Sheets

U.S. PATENT DOCUMENTS

| | | | | |
|---|---|---|---|---|
| 7,521,131 B2 * | 4/2009 | Yamamoto | | 428/698 |
| 7,879,443 B2 * | 2/2011 | Endrino | | 428/697 |
| 7,960,016 B2 * | 6/2011 | Lechthaler et al. | | 428/336 |
| 8,211,554 B2 * | 7/2012 | Fontaine et al. | | 428/699 |
| 2008/0229891 A1 | 9/2008 | Lechthaler | | |
| 2008/0318062 A1 * | 12/2008 | Endrino et al. | | 428/446 |

FOREIGN PATENT DOCUMENTS

| | | | |
|---|---|---|---|
| JP | 2002-337007 | * | 11/2002 |
| WO | 2006/005217 | A2 | 1/2006 |
| WO | 2006/084404 | A1 | 8/2006 |
| WO | 2008/037556 | A2 | 4/2008 |

OTHER PUBLICATIONS

Wuhrer et al "A comparative study of magnetron co-sputtered nanocrystalline titanium aluminium and chromium aluminium nitride coatings" Scripta MAterials 50 (2004) p. 1461-1466.*

International Search Report for PCT/EP2009/058423 dated Oct. 6, 2009.

Written Opinion for PCT/EP2009/058423 dated Oct. 6, 2009.

* cited by examiner

COATING SYSTEM, COATED WORKPIECE AND METHOD FOR MANUFACTURING THE SAME

CROSS-REFERENCE TO RELATED APPLICATIONS

This application is the National Stage of International Application No. PCT/EP2009/058423, filed Jul. 3, 2009, which claims the benefit of U.S. Provisional Application No. 61/079,230, filed Jul. 9, 2008, the entire disclosures of which are incorporated herein by reference.

TECHNICAL FIELD

The invention relates to the field of coated workpieces and the manufacture thereof. More particularly, it relates to wear protection of workpieces by wear protective coatings and to the deposition of such coatings.

BACKGROUND OF THE INVENTION

TiAlN coatings are widely used as physical vapor deposition (PVD) coatings for wear protective applications. The AlCrN system is reported to exhibit superior mechanical properties such as hardness and hot hardness, thermal and tribological properties resulting in superior application lifetime of coated parts. As commonly understood in the art, stoichiometric indices are not explicitly quoted, e.g., AlCrN stands, more precisely, for $(Al_yCr_{1-y})N$ $(0<y<1)$.

U.S. Pat. No. 7,226,670 discloses a workpiece coated with a system of film layers comprising at least one film composed of $(Al_yCr_{1-y})X$ where X=N, C, B, CN, BN, CBN, NO, CO, BO, CNO, BNO or BNCO, the workpiece being a milling tool, a hob, a ball nose mill, a planar or a profiling cutter, a clearing tool, a reamer, an insert for turning and milling, a die or an injection mold, showing a superior wear protective performance.

U.S. Pat. No. 7,348,074 discloses coating concepts consisting of a multilayer structure with 10 layer packets. These concepts show good protective performance in drilling applications.

US patent application US 2008/0229891 discloses a multilayered coating which comprises at least one layer A comprising as material (TiAl)X, where X=N, CN, CNO or NO, or of (AlCr)X, where X=N, CN, CNO or NO, and comprising at least one layer B with (AlCrSiMe)X where X=N, CN, CNO or NO, wherein Me stands for Nb, Mo, Ta or W.

Furthermore, said US 2008/0229891 discloses that the layer structure of said at least one layer B is designed to consist of at least of two different crystalline phases. This could be for example a cubic and a hexagonal phase fraction.

In said US 2008/0229891, it is further disclosed that the thickness ratio between layer A and layer B is an important issue in the sense that coatings with thickness ratios of layer A to layer B above 1 seem to exhibit inferior performance.

All these prior art coatings show good wear protective performance for more or less special applications. It remains therefore a need to provide a wear protective coating for a broad range of different applications.

SUMMARY OF THE INVENTION

Therefore, one object of the invention is to create a coating system that does not have the disadvantages mentioned above. In particular, a coating system shall be provided, which can be used for a broad range of different applications.

In addition, the respective coated workpiece and the corresponding method for manufacturing such a workpiece shall be provided.

Another object of the invention is to provide a coating system, a correspondingly coated workpiece and a method for manufacturing such a workpiece providing improved wear protective and/or wear resistant properties.

Another object of the invention is to provide a coating system for coating a workpiece, a correspondingly coated workpiece and a method for manufacturing such a workpiece which provide an increased tool lifetime for a very broad range of applications. Therein, said applications may comprise continuous and interrupted cutting applications including, but not limited to drilling, milling, reaming, turning, tapping, threading and bobbing applications.

Another object of the invention is to provide a coating system for coating a workpiece, a correspondingly coated workpiece and a method for manufacturing such a workpiece, wherein said workpieces are workpieces for machining parts which can be made of various materials such as, e.g., ferrous and non-ferrous metals as well as composite materials.

Another object of the invention is to provide a coating system for coating a workpiece, a correspondingly coated workpiece and a method for manufacturing such a workpiece, wherein said workpieces may be used under various working conditions, such as, for example, dry cutting, cutting with emulsion and/or liquid coolants, cutting with minimal quantity lubrication (MQL) and cutting with gaseous coolants.

Another object of the invention is to provide a coating system for coating a workpiece, a correspondingly coated workpiece and a method for manufacturing such a workpiece, wherein said workpiece is a drill, an endmill, an insert, or a hob.

Another object of the invention is to provide a coating system for coating a workpiece, a correspondingly coated workpiece and a method for manufacturing such a workpiece, wherein said workpiece substrate is substantially made of steel, in particular high-speed steel, cemented carbide, cubic boron nitride, cermet or a ceramic material.

Another object of the invention is to provide a coating system for coating a workpiece, a correspondingly coated workpiece and a method for manufacturing such a workpiece, wherein said workpiece is suitable for application in machining of at least one of, preferably most of: ferrous and nonferrous materials, preferably hardened steel, annealed steel, alloyed steel, low carbon steel, stainless steel, titanium-based alloys, nickel-based alloys and composite materials.

Another object of the invention is to provide a coating system for coating a workpiece, a correspondingly coated workpiece and a method for manufacturing such a workpiece, wherein the coating shall have superior mechanical and thermal properties, in particular with respect to hardness, hot hardness and oxidation resistance.

Another object of the invention is to provide a coating system for coating a workpiece, a correspondingly coated workpiece and a method for manufacturing such a workpiece, wherein the coating shall provide superior protection of the work piece at low and high temperature application conditions.

Another object of the invention is to provide a method for manufacturing a coated workpiece, in particular a workpiece as mentioned above, which can be carried out particularly time-efficiently.

Another object of the invention is to provide a method for manufacturing a coated workpiece, in particular a workpiece as mentioned above, which is particularly simple to carry out.

Further objects emerge from the description and embodiments below.

At least one of these objects is at least partially achieved by coating systems, workpieces and/or methods according to the patent claims.

The coating system is a multilayer coating comprising at least one layer A essentially consisting of $(Al_yCr_{1-y})X$, wherein X=N, CN, BN, NO, CNO, CBN, BNO or CNBO, and y describes the stoichiometric composition of the metallic phase fraction. Said multilayer coating further is proposed to comprise at least one layer B essentially consisting of $(Al_uCr_{1-u-v-w}Si_vMe_w)X$, wherein X=N, CN, BN, NO, CNO, CBN, BNO or CNBO, and wherein Me=W, Nb, Mo, Ta or a mixture thereof, and wherein u, v, w describe the stoichiometric composition of the metallic phase fraction. Through this, a wear-protective coating system can be provided, which can be used for a broad range of different applications.

Index y stands, more precisely and as agreed in the art, for a number with $0<y<1$, and also more precisely and as agreed in the art, u is a number with $0<u<1$, v is a number with $0<v<1$, and w is a number with $0<w<1$, wherein $u+v+w=1$. Furthermore, more precisely and as agreed in the art, the stoichiometric value of X is always 1, i.e. in case X comprises more than one chemical element, the sum of the stoichiometric indices of these elements is one, e.g., in case of X=BNO, X depicts $B_{1-a-b}N_aO_b$ (and $0<a<1$ and $0<b<1$).

In one embodiment, a thickness ratio of layer A to layer B higher than 1, and more preferably higher than about 1.5 is realized. Through this, particularly good wear-protection can be achieved. A thicker layer of type A in combination with a thinner layer of type B yields excellent results.

In one embodiment which may be combined with one or more of the before-addressed embodiments, said at least one layer of type B is designed to comprise at least two crystalline phases, more particularly said at least one layer of type B substantially comprises exactly two crystalline phases.

In this embodiment, a first crystalline phase of said at least one layer of type B is a cubic phase and the second crystalline phase of said at least one layer of type B is a hexagonal phase.

In this case, in a special embodiment, the hexagonal phase content is <50% of the layer volume of said at least one layer of type B, and more particularly amounts to between 5% and 40%.

In one embodiment which may be combined with one or more of the before-addressed embodiments, said at least one layer of type A essentially is of cubic structure.

In one embodiment which may be combined with one or more of the before-addressed embodiments, the stoichiometric composition of the metallic fraction of said at least one layer of type A is characterized by $0.5<y<0.7$.

In one embodiment which may be combined with one or more of the before-addressed embodiments, the stoichiometric composition of the metallic fraction of said at least one layer of type B is characterized by $0.5<u<0.7$, $0.01<v<0.15$ and $0.002<w<0.1$, and more particularly $w<0.05$.

In one embodiment which may be combined with one or more of the before-addressed embodiments, a layer of type B is directly deposited onto a layer of type A.

In one embodiment which may be combined with one or more of the before-addressed embodiments, a layer of type B is sandwiched between a first layer of type A and a second layer of type A.

In one embodiment which may be combined with one or more of the before-addressed embodiments, a layer of type A and a layer of type B form a period, and said coating system is a coating system with multiple such periods.

In one embodiment which may be combined with one or more of the before-addressed embodiments, said coating system comprises another layer, in particular said other layer forming a functional layer. E.g., said other layer being an adhesion layer, more particularly deposited directly onto a substrate, and in particular immediately below the first layer of type A; or, e.g., said other layer being a top layer, i.e. the layer is deposited as last layer, in particular is a decorative top layer.

The workpiece according to the invention comprises a coating system according to the invention. The workpiece benefits from the advantages of the coating system in an analogous way.

In one embodiment (which actually is an enumeration of various possible embodiments), said workpiece is at least one of the group consisting of: a tool, a machining tool, a milling tool, a cutting tool, a turning tool, a tapping tool, a threading tool, a reamer, an end mill, a drill, a cutting insert, a gear cutting tool, an insert, a hob, a clearing tool, an insert for turning and milling.

In one embodiment which may be combined with one or more of the before-addressed embodiments (and which actually is an enumeration of various possible embodiments), said workpiece has a body substantially made of at least one of the group consisting of: a ferrous metal, non-ferrous metal, a composite material, a cemented carbide, a cermet, a cubic boron nitride, a ceramic material, a steel, a high speed steel.

In one aspect, the invention comprises a method for manufacturing a coated workpiece, more particularly, a PVD (physical vapor deposition) process which allows to synthesize a coating system, more particularly a coating system according to the invention, not only in separate deposition processes but also within one deposition process.

The method for manufacturing a coated workpiece comprises the steps of
a) depositing on said workpiece at least one layer of a type A; and
b) depositing on said workpiece at least one layer of a type B different from said type A;
wherein
said at least one layer of a type A is deposited using $n_x$ targets of a type X; and
said at least one layer of a type B is deposited using $n_y$ targets of a type Y different from said type X and simultaneously using $n_{xy}$ targets of said type X;
wherein $n_x$, $n_y$, and $n_{xy}$ are integers $\geq 1$, and at least one of said targets of said type X is active during both, step a) and step b). This way, significantly reduced deposition times can be realized. One or more targets can be active during both, the deposition of a layer of type B and the deposition of a layer of type A. This can also be advantageous in terms of process stability. The deposition can be carried out in little time, and the depositing steps can be carried out in the same vacuum chamber without breaking the vacuum.

In one embodiment, $n_x \geq n_{xy}$ applies.

In one embodiment, $n_x = n_{xy}$ applies. In this case, all targets of type X active during deposition of said at least one layer of type A are also active during deposition of said at least one layer of type B.

In one embodiment of the method which may be combined with one or more of the before-addressed method embodiments, a layer of type A substantially consists of $(Al_yCr_{1-y})X$, wherein X depicts one of the group consisting of N, CN, BN, NO, CNO, CBN, BNO and CNBO, y describing the stoichiometric composition of the metallic phase fraction; and a layer of type B substantially consists of $(Al_uCr_{1-u-v-w}Si_vMe_w)X$, wherein X depicts one of the group consisting of N, CN, BN, NO, CNO, CBN, BNO or CNBO, and wherein Me depicts one of the group consisting of W, Nb, Mo and Ta or a mixture of two or more of the constituents of that group, u, v and w describing the stoichiometric composition of the metallic phase fraction.

In one embodiment of the method which may be combined with one or more of the before-addressed method embodiments, a thickness ratio of said layer of type A to said layer of type B is higher than 1, in particular higher than about 1.5. In other words, steps a) and b) are carried out such that a thickness of the layer of type A is larger, in particular larger by a factor of more than about 1.5, than a thickness of the layer of type B.

In one embodiment of the method which may be combined with one or more of the before-addressed method embodiments, a target of said type X comprises Al and Cr, and a target of type Y comprises Al, Cr, Si and said Me provided in said layer of type B.

In one embodiment of the method which may be combined with one or more of the before-addressed method embodiments, steps a) and b) are carried out using a physical vapor deposition process, in particular a cathodic arc evaporation process.

In one embodiment of the method which may be combined with one or more of the before-addressed method embodiments, the deposition process is characterized by a deposition temperature <650° C. and preferably at or below about 500° C., and/or by a reactive gas atmosphere comprising predominantly N and/or with a total gas pressure situated between 0.5 and 10 Pa, preferably >2 Pa, and/or by a bias voltage of between 40 and 200 V and/or where the bias voltage during the deposition of said at least one layer of type A is lower than during the deposition of said at least one layer of type B in the multilayered structure.

The invention comprises methods with features of corresponding coating systems and workpieces according to the invention, and vice versa.

The advantages of the methods correspond to the advantages of corresponding coating systems and workpieces and vice versa.

Further embodiments and advantages emerge from the dependent claims and the figures.

BRIEF DESCRIPTION OF THE DRAWINGS

Below, the invention is described in more detail by means of examples and the included drawings. The figures show.

Figure 1:
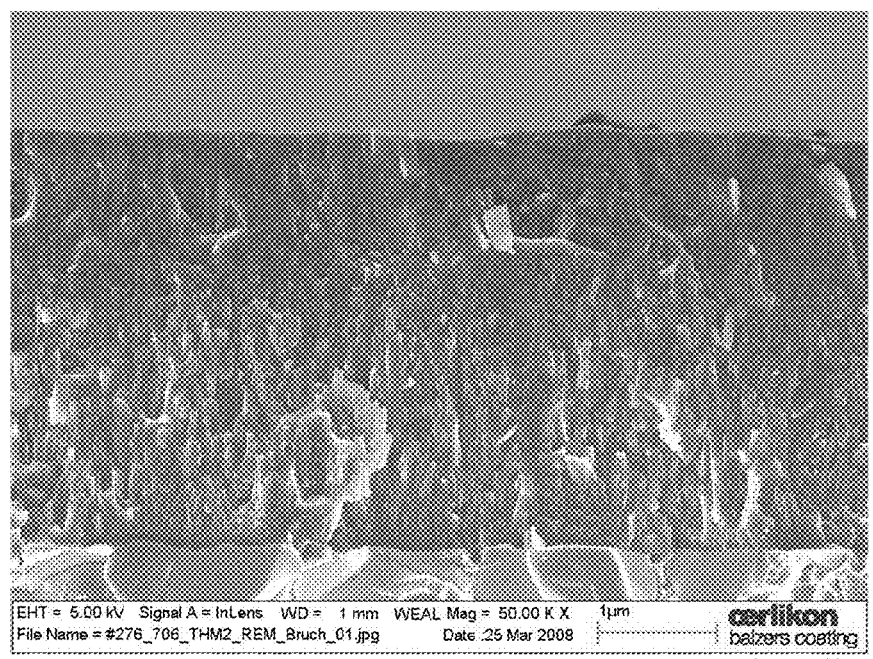
FIG. 1 an SEM (scanning electron microscopy) image showing the structure of a coating according to an embodiment of the present invention.

The reference symbols used in the figures and their meaning are summarized in the list of reference symbols. The described embodiments are meant as examples and shall not confine the invention.

DETAILED DESCRIPTION OF THE INVENTION

In the following, the invention will be explained more closely in conjunction with some application examples.

As mentioned above, it is one possible object of the present invention to present a coating system (or shortly a "coating") showing excellent protective wear resistance for a very broad range of applications. In order to demonstrate the superiority of coatings according to the invention over prior art coatings, we firstly introduce a number of prior art coatings together with a number of different coatings according to the invention by describing how they are produced.

Then we will discuss different application examples with highly differing machining conditions representing applications such as for example drilling or milling of soft, annealed or hard material, and discuss the performance of the coatings according to the invention as compared to the prior art coatings.

All of the following coatings have been synthesized using cathodic arc evaporation in an arc evaporation equipment. The workpieces are placed into a chamber (vacuum chamber) of suitable arc evaporation equipment. In such a coating equipment, targets are used as for example those shown in table 1.

Table 1 indicates for each of six samples (coatings) the elemental composition (in atomic percent) of the targets used and the elemental composition of respectively deposited layers. Finally, table 1 shows application test results for four different applications (appl 1 to appl 4).

Layer thicknesses are in the usual thickness range for wear-protective coatings. The overall thickness of the coating system will usually not exceed about 20 μm.

TABLE 1

| No. | target X composition | | target Y composition (% at) | | | | layer I composition | | layer II composition | | | | appl 1 single passes | appl 2 single passes | appl 3 Nr. of single | appl 4 Nr. of single |
|---|---|---|---|---|---|---|---|---|---|---|---|---|---|---|---|---|
| | Al | Cr | Al | Cr | Si | W | Al | Cr | Al | Cr | Si | W | | | | |
| 1 | 70 | 30 | — | — | — | — | 70 | 30 | 70 | 30 | — | — | 10 | 12 | 8 | 11 |
| 2 | 70 | 30 | — | — | 15 | — | Ti = 85 | | multilayer system | | | | 9 | 9 | 9 | 11 |
| 3 | 50 | — Ti = 50 | 57 | 31 | 10 | 2 | — | 50 Ti = 50 | 57 | 31 | 10 | 2 | 11 | 10 | 7 | 16 |
| 4 | 70 | 30 | — | 70 | 18 | 10 | 2 | 70 | 30 | 70 | 26 | 3 | 1 | 17 | 12 | 18 | 17 |
| 5 | 70 | 30 | — | 55 | 30 | 10 | 5 | 70 | 30 | 65 | 30 | 3 | 2 | 17 | 12 | 17 | 17 |
| 6 | 70 | 30 | — | 40 | 40 | 20 | — | 70 | 30 | 60 | 34 | 6 | — | 11 | 11 | 9 | 12 |

Samples No. 1, 2 and 3 are coatings as known in the art.

Prior art coating No. 1 describes a monolayer of AlCrN deposited with six equal AlCr targets with the composition of 70% Al and 30% Cr as shown in table 1. The deposition was conducted in a pure $N_2$-atmosphere at a gas pressure of 3.5 Pa and a bias voltage of −40 to −100V at 500° C. at the substrate.

Prior art coating No. 2 was, differing from example No. 1, conducted using four AlCr targets and two TiSi targets. The compositions of the targets are shown in table 1. The evaporation was conducted in a pure $N_2$-atmosphere at a pressure of 3.5 Pa and a bias voltage of −40V at about 500° C. at the substrate. Prior art coating No. 2 was synthesized as a multilayered coating having a bottom layer of AlCrN followed by 10 layer packages (AlCrN, TiSiN, AlCrTiSiN) and a TiSiN top layer.

Prior art coating No. 3 was deposited using four AlCrSiW targets and two TiAl targets with the compositions mentioned in the corresponding line in table 1. Firstly, a TiAlN support layer was deposited which was followed by an AlCrSiWN main layer. The thickness relation between the main layer and the support layer is in the range of 1:2.5. The evaporation was conducted in a pure $N_2$ atmosphere at 3.5 Pa, and the bias voltage was adjusted between −40 V and −100V at about 600° C. at the substrate.

The deposition of the coatings No. 4, 5 and 6 has been carried out at a deposition temperature of 500° C. and a total pressure of 4 Pa in a nitrogen atmosphere, using the respective target compositions as shown in table 1. All three coatings comprise a first layer (also referred to "layer I" or as layer of type A or as layer A) and a second layer (also referred to "layer II" or as layer of type B or as layer B).

Coating No. 4 is a coating according to a first embodiment of the invention. Here, for the first layer four AlCr targets with the composition as shown in table 1 in the X-target column were used, while a low bias voltage between −40 V and −100 V was applied to the sample. This may be constant, or it may be varied. For the second layer, the four AlCr targets and, in addition, two AlCrSiW targets with the composition as shown in table 1 in the Y-target column were used, while a higher bias voltage of −100 V to −200 V was applied to the sample. The absolute value of the bias voltage during deposition of the second layer was at least 50 V, or preferably 100 V higher than the bias voltage during deposition of the first layer. The resulting concentration of Al together with the chosen bias leads to a fraction of hexagonal phase in the second layer, as it has been described above for a particular embodiment of the invention in which the second layer (layer B, more precisely layer of type B) comprises at least two crystalline phases (usually cubic and hexagonal).

Coating 5 is a coating according to a second embodiment of the invention. Compared to coating No. 4, it has a higher tungsten content, while the aluminum content did not dramatically decrease and still remains well above 60% (see table 1).

In contrast to this, coating No. 6 shows an aluminum percentage of 60% or below. No tungsten was used, i.e. the targets did not contain tungsten, see table 1. In this configuration, no hexagonal fraction was realized.

The last four columns of table 1 show the results of the different application tests.

Application test nr 1 ("appl 1") is defined as follows:
Milling conditions:
Workpiece (to be milled): DIN 1.2344 (45 HRC)

| Cutting tool: | 4-fluted end-mill, ⌀ 10 mm, micro grain carbide grade |
|---|---|
| Cutting speed: | 120 mmin$^{-1}$ |
| Feed rate: | 0.1 mm/tooth |
| Radial depth of cut: | 0.5 mm |
| Axial depth of cut: | 10 mm |
| Coolant: | lubricant 6% emulsion |
| Milling operation: | side milling |
| Length of single pass: | 15 m |
| End of lifetime: | wear measurement after each single pass: criterion for end of lifetime: $V_{bmax} > 120$ μm at the end a single pass |

Application test nr 2 ("appl 2") is defined as follows:
Milling conditions:
Workpiece (to be milled): DIN1.1191 (190 HB)

| Cutting tool (coated): | 4-fluted end-mill, ⌀ 10 mm, micro grain carbide grade |
|---|---|
| Cutting speed: | 400 mmin$^{-1}$ |
| Feed rate: | 0.2 mm/tooth |
| Radial depth of cut: | 0.5 mm |
| Axial depth of cut: | 10 mm |
| Coolant: | dry cutting |
| Milling operation: | side milling |
| Length of single pass: | 50 m |
| End of lifetime: | wear measurement after each single pass: criterion for end of lifetime: $V_{bmax} > 120$ μm at the end a single pass |

Application test nr 3 ("appl 3") is defined as follows:
Milling conditions:
Workpiece (to be milled): DIN GGG50

| Cutting tool (coated): | 2-fluted drills, ⌀ 6 mm, micro grain carbide grade |
|---|---|
| Cutting speed: | 120 mmin$^{-1}$ |
| Feed rate: | 0.25 mm/tooth |
| Depth of cut: | 6 × diameter |
| Coolant: | internal cooling-lubricant 6% emulsion |
| Milling operation: | drilling |
| Length of single pass: | 200 holes |
| End of lifetime: | wear measurement after each single pass: criterion for end of lifetime: $V_{bmax} > 250$ μm at the end a single pass |

Application test nr 4 ("appl 4") is defined as follows:
Milling conditions:
Workpiece (to be milled): DIN 1.2344 (52 HRC)

| Cutting tool (coated): | 2-fluted ballnose endmill, ⌀ 10 mm, micro grain carbide grade |
|---|---|
| Cutting speed: | 147 mmin$^{-1}$ |
| Feed rate: | 0.15 mm/tooth |
| Radial depth of cut: | 4 mm |
| Axial depth of cut: | 0.8 mm |
| Coolant: | compressed air |
| Milling operation: | side milling |
| Length of single pass: | 15 m |

| End of lifetime: | wear measurement after each single pass: criterion for end of lifetime: $V_{bmax} > 200$ μm at the end a single pass |
|---|---|

$V_{bmax}$ represents, as common in the art, the maximum allowable flank wear.

As can be seen from the last four columns of table 1, the coatings 4 and 5 show the best and the second best results in all four application tests. Accordingly, these coatings are not only applicable in a broad range of applications, but can also be deposited on a variety of workpieces.

Furthermore, as can be seen from the columns in table 1 related to the first application test, third test and forth test, the non-prior-art coatings provide significantly better results than prior art coatings.

It is to be noted, that the coating time required for preparing coatings No. 4 and 5 (namely 270 min) is significantly below the time required for preparing coating No. 2 (340 min) and No. 3 (410 min) and well within the range of the coating time of coating No. 1 (namely 240 min). This is basically due to the concurrent use of different targets as done for the second layer (layer B, referred to as layer II in table 1). Targets X can be active during the whole deposition process (at least as long as a layer I (layer A) or a layer II (layer B) is deposited, whereas targets Y are activated (in addition to the targets X) only when a layer II (layer B) is deposited.

FIG. 1 shows an SEM (scanning electron microscopy) image showing the structure of a coating according to an embodiment of the present invention. As can be seen, the overall thickness of the coating system in FIG. 1 is about 3 μm, and the thickness ratio of layer A to layer B is about 2.

Figure 2:
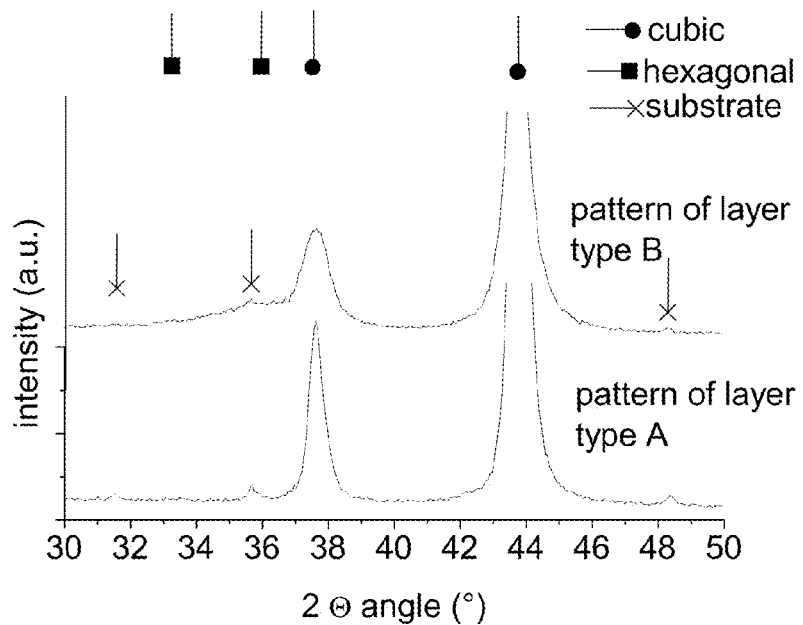
FIG. 2 XRD (X-ray diffraction) patterns of single layers of type A and type B, respectively.

FIG. 2 shows XRD (X-ray diffraction) patterns of single layers of type A and type B, respectively. The hexagonal phase shows peaks with lower intensity but higher mean indicating the lower grain size of hexagonal crystal grains.

Figure 3:
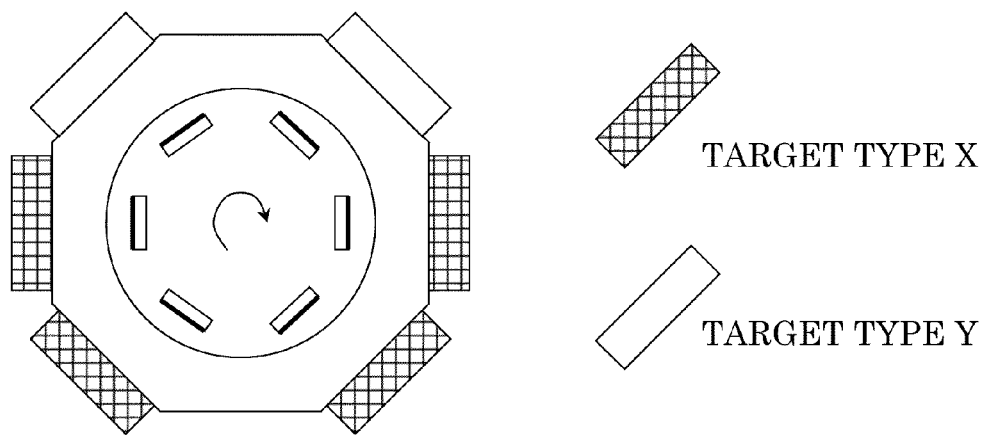
FIG. 3 a schematized detail of an exemplary configured vacuum deposition chamber, in a top view.

FIG. 3 shows a schematized detail of an exemplary configured vacuum deposition chamber, in a top view. Six targets are indicated, two of type Y and four of type X. Workpieces to be coated are located on a sample carousel symbolized by the circle and the circular arrow. The six workpieces are schematically shown as rectangles. Such a configuration is suitable for manufacturing coatings such as coatings No. 4, 5 or 6 discussed above.

Figure 4:
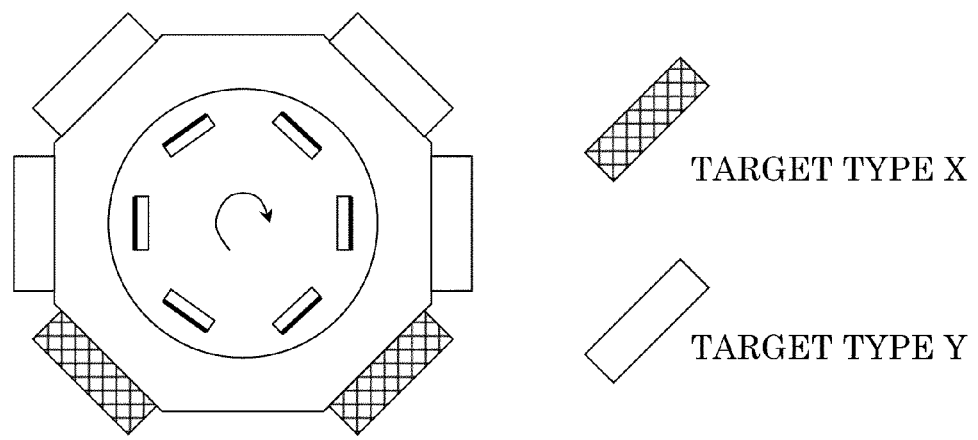
FIG. 4 a schematized detail of an exemplary configured vacuum deposition chamber, in a top view.

FIG. 4 shows, in the manner of FIG. 3, a schematized detail of an exemplary configured vacuum deposition chamber, in a top view.

Figure 5:
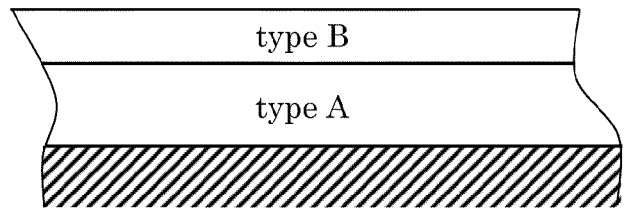
FIG. 5 a layer structure of a coating system.

FIG. 5 shows a layer structure of a coating system. The coating system consists of a layer of type A deposited on a substrate (dashed in FIG. 5) and a layer of type B deposited on said layer of type A, as is the case for the coatings No. 4, 5, and 6 discussed above (cf. table 1). Note also that layer A is thicker than layer B. For depositing layer A, targets of type X are activated, and for depositing layer B, said targets of type X and, in addition, targets of type Y are activated, cf. also FIGS. 3 and 4. Furthermore, it is possible, when using two types X and Y of targets, to deposit also a third type of layer, namely a layer of type C, which is deposited using solely one or more targets of type Y. Such a layer could, e.g., be arranged between layer A and the substrate such as to form, e.g., an adhesion layer, or it could be deposited on top of layer B, such as to form a top layer, e.g., a decorative top layer.

Figure 6:
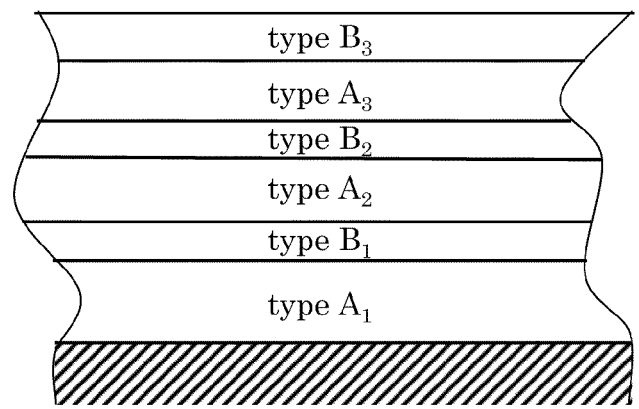
FIG. 6 a layer structure of a coating system.

FIG. 6 shows a layer structure of a coating system. In this case, the coating system is a multilayer system with six layers, consisting of three pairs of a layer of type A and a layer of type B each; one layer A and one layer B forming one layer period which repeatedly occurs. It is possible, as shown in FIG. 6, to provide that in each layer period, the thickness of the layer A is greater than the thickness of the layer B.

Figure 7:
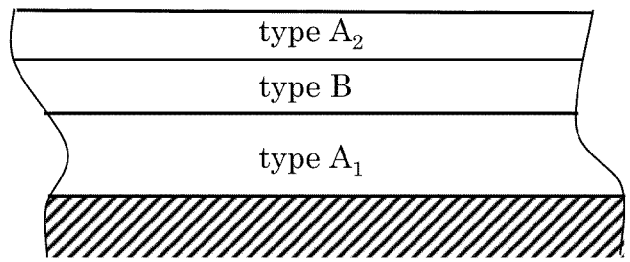
FIG. 7 a layer structure of a coating system.

FIG. 7 shows a layer structure of a coating system. In this case, three layers are provided on the substrate. One layer B is sandwiched between two layers A.

Figure 8:
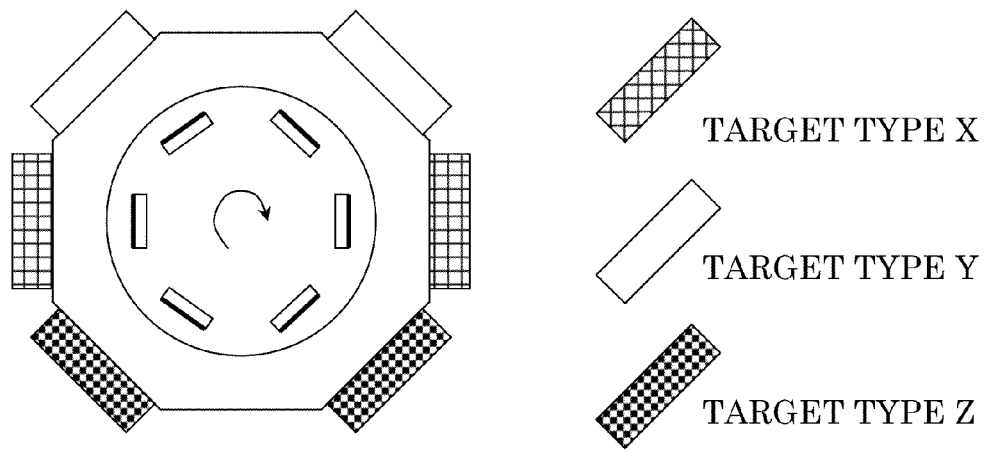
FIG. 8 a schematized detail of an exemplary configured vacuum deposition chamber, in a top view.

FIG. 8 shows, in the manner of FIGS. 3 and 4, a schematized detail of an exemplary configured vacuum deposition chamber, in a top view. In this case, three types of targets are provided: type X, type Y, type Z. This allows to deposit three different layer types or even four different layer types while using two or all three target types at least partially simultaneously. Considering also using each target type alone, it is possible to deposit up to seven different layer types; and considering activating and deactivating one or more targets of the same type, even more different layer types can be deposited.

Figure 9:
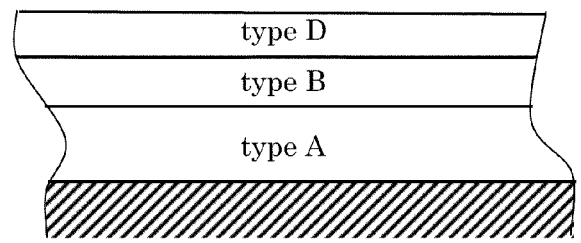
FIG. 9 a layer structure of a coating system, comprising an additional top layer (e.g., a decorative top layer), as can be deposited in a vacuum deposition chamber configured as shown in FIG. 8.

In a simple case, a configuration as shown in FIG. 8 can be used for depositing a coating system as shown in FIG. 9.

FIG. 9 shows a layer structure of a coating system, comprising an additional top layer (e.g., a decorative top layer), as can be deposited in a vacuum deposition chamber configured as shown in FIG. 8. E.g., for depositing layer A, only targets X are activated; for depositing layer B, targets X and, in addition, targets Y are activated; and for depositing layer D, e.g., only targets Z are activated, or some combination of target Z with one or more targets of one or both other target types.

The invention claimed is:

1. A coating system, comprising
    at least one layer of type A, the layer of type A consisting essentially of $(Al_yCr_{1-y})X$, wherein X depicts one of the group consisting of N, CN, BN, NO, CNO, CBN, BNO and CNBO, y describing a stoichiometric composition of a metallic phase fraction; and
    at least one layer of type B, the layer of type B consisting essentially of $(Al_uCr_{1-u-v-w}Si_vMe_w)X$, wherein X depicts one of the group consisting of N, CN, BN, NO, CNO, CBN, BNO and CNBO, and wherein Me depicts one of the group consisting of W, Nb, Mo and Ta or a mixture of two or more of the constituents of that group, u, v and w describing a stoichiometric composition of a metallic phase fraction;
    wherein a thickness ratio of said layer of type A to said layer of type B is higher than 1, and
    wherein 0<y, u, w, v<1.

2. The coating system according to claim 1, wherein said thickness ratio is higher than about 1.5.

3. The coating system according to claim 1, said at least one layer of type B comprising at least two crystalline phases.

4. The coating system according to claim 1, said at least one layer of type B comprising a cubic phase and a hexagonal phase.

5. The coating system according to claim 4, wherein a content of said at least one layer of type B of said hexagonal phase is <50% by volume of said at least one layer of type B.

6. The coating system according to claim 4, wherein a content of said at least one layer of type B of said hexagonal phase is >5% by volume of said at least one layer of type B and <40% by volume of said at least one layer of type B.

7. The coating system according to claim 1, said at least one layer of type A substantially being of cubic structure.

8. The coating system according to claim 1, wherein 0.5<y<0.7.

9. The coating system according to claim 1, wherein 0.5<u<0.7, 0.01<v<0.15, and 0.002<w<0.1.

10. The coating system according to claim 9, wherein w<0.05.

11. The coating system according to claim 1, wherein said at least one layer of type B is deposited directly onto said at least one layer of type A.

12. The coating system according to claim 1, comprising one layer of type B sandwiched between a first layer of type A and a second layer of type A.

13. The coating system according to claim 1, comprising multiple layer periods, wherein one such layer period is formed by one layer of type A and one layer of type B.

14. A workpiece, comprising a coating system according to claim 1.

15. The workpiece according to claim 14, wherein said workpiece is at least one of the group consisting of
- a machining tool;
- a milling tool;
- a cutting tool;
- a turning tool;
- a tapping tool;
- a threading tool;
- a reamer;
- an end mill;
- a drill;
- a cutting insert;
- a hob;
- a clearing tool; and
- an insert for turning and milling.

16. The workpiece according to claim 14, wherein said workpiece is one or more of the group consisting of a tool, a reamer, an end mill, a drill, a cutting insert, a hob, and an insert for turning and milling.

17. The workpiece according to claim 14, wherein said workpiece is one or more of the group consisting of a machining tool, a milling tool, a turning tool, a tapping tool, a threading tool, a reamer, an end mill, a drill, a cutting insert, a gear cutting tool, a hob, a clearing tool, and an insert for turning and milling.

18. The workpiece according to claim 14, wherein said workpiece is one or more of the group consisting of a machining tool, a milling tool, a turning tool, a tapping tool, a threading tool, a reamer, an end mill, a drill, a cutting insert, a gear cutting tool, an insert, a hob, and a clearing tool.

19. The workpiece according to claim 14, wherein said workpiece has a body substantially made of one or more of the group consisting of a ferrous metal, a non-ferrous metal, a composite material, a cermet, and a cubic boron nitride.

20. The workpiece according to claim 14, wherein said workpiece has a body substantially made of one or more of the group consisting of a non-ferrous metal, a composite material, a cemented carbide, a cubic boron nitride, a ceramic material, and a steel.

21. The workpiece according to claim 14, wherein said workpiece has a body substantially made of one or more of the group consisting of a non-ferrous metal, a composite material, a cemented carbide, a cubic boron nitride, a ceramic material, and a high speed steel.

22. The workpiece according to claim 14 or claim 15, said workpiece having a body substantially made of at least one of the group consisting of
- a ferrous metal;
- a non-ferrous metal;
- a composite material;
- a cemented carbide;
- a cubic boron nitride; and
- a ceramic material.

23. A method for manufacturing a coated workpiece, comprising the steps of
  a) depositing on said workpiece at least one layer of a type A; and
  b) depositing on said workpiece at least one layer of a type B different from said type A;
wherein
  said at least one layer of a type A is deposited using $n_x$ targets of a type X; and
  said at least one layer of a type B is deposited using $n_y$ targets of a type Y different from said type X and simultaneously using $n_{xy}$ targets of said type X;
  wherein $n_x$, $n_y$, and $n_{xy}$ are integers $\geq 1$, and at least one of said targets of said type X is active during both step a) and step b).

24. The method according to claim 23, wherein
  a layer of type A consists essentially of $(Al_yCr_{1-y})X$, wherein X depicts one of the group consisting of N, CN, BN, NO, CNO, CBN, BNO and CNBO, y describing a stoichiometric composition of a metallic phase fraction;
  a layer of type B consists essentially of $(Al_uCr_{1-u-v-w}Si_vMe_w)X$, wherein X depicts one of the group consisting of N, CN, BN, NO, CNO, CBN, BNO and CNBO, and wherein Me depicts one of the group consisting of W, Nb, Mo and Ta or a mixture of two or more of the constituents of that group, u, v and w describing a stoichiometric composition of a metallic phase fraction; and
  $0<y, u, w, v<1$.

25. The method according to claim 24, wherein a thickness ratio of said layer of type A to said layer of type B is higher than 1.

26. The method according to claim 24, wherein a target of said type X comprises Al and Cr, and a target of type Y comprises Al, Cr, Si and said Me provided in said layer of type B.

27. The method according to claim 23, wherein steps a) and b) are carried out using a physical vapor deposition process.

28. The method according to claim 27, wherein steps a) and b) are carried out using a cathodic arc evaporation process.

29. The method according to claim 23, comprising holding said workpiece at a temperature below approximately 650° C. while carrying out steps a) and b).

30. The method according to claim 29, comprising holding said workpiece at a temperature at or below approximately 500° C., while carrying out steps a) and b).

31. The method according to claim 23, comprising exposing said workpiece to a reactive gas atmosphere with a total gas pressure between 0.5 Pa and 10 Pa while carrying out steps a) and b).

32. The method according to claim 31, comprising exposing said workpiece to a reactive gas atmosphere with a total gas pressure >2 Pa, while carrying out steps a) and b).

33. The method according to claim 31, said reactive gas atmosphere comprising predominantly N.

34. The method according to claim 23, comprising applying a bias voltage between 40 V and 200 V to said workpiece while carrying out steps a) and b).

35. The method according to claim 23, comprising applying a bias voltage to said workpiece while carrying out step a) and applying a higher bias voltage to said workpiece while carrying out step b).

* * * * *

UNITED STATES PATENT AND TRADEMARK OFFICE
CERTIFICATE OF CORRECTION

| | |
|---|---|
| PATENT NO. | : 8,491,989 B2 |
| APPLICATION NO. | : 13/002687 |
| DATED | : July 23, 2013 |
| INVENTOR(S) | : Lechthaler |

It is certified that error appears in the above-identified patent and that said Letters Patent is hereby corrected as shown below:

On the title page, Item [73], please delete "Oberlikon" and add -- Oerlikon --

Signed and Sealed this
First Day of October, 2013

Teresa Stanek Rea
*Deputy Director of the United States Patent and Trademark Office*